(12) United States Patent
Sowers et al.

(10) Patent No.: US 9,641,144 B2
(45) Date of Patent: May 2, 2017

(54) SOLID STATE TRAVELING WAVE AMPLIFIER FOR SPACE APPLICATIONS

(71) Applicant: Space Systems/Loral, LLC, Palo Alto, CA (US)

(72) Inventors: James J. Sowers, Sunnyvale, CA (US); Perry Peterson, Mountain View, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 0 days.

(21) Appl. No.: 14/729,883

(22) Filed: Jun. 3, 2015

(65) Prior Publication Data

US 2016/0359464 A1 Dec. 8, 2016

(51) Int. Cl.
*H03F 3/60* (2006.01)
*H03F 3/55* (2006.01)
*H03F 3/19* (2006.01)

(52) U.S. Cl.
CPC ............ *H03F 3/55* (2013.01); *H03F 3/19* (2013.01); *H03F 2200/451* (2013.01)

(58) Field of Classification Search
USPC ............... 330/295, 124 R, 84, 286, 53–54
See application file for complete search history.

(56) References Cited

U.S. PATENT DOCUMENTS

| 2,957,143 | A | 10/1960 | Enloe |
| 3,593,174 | A | 7/1971 | White |
| 4,092,516 | A | 5/1978 | Martin |
| 4,092,616 | A | 5/1978 | Osterwalder |
| 4,689,631 | A | 8/1987 | Gans et al. |
| 5,365,197 | A | 11/1994 | Ikalainen |

(Continued)

FOREIGN PATENT DOCUMENTS

| EP | 1 039 574 A2 | 9/2000 |
| JP | 2007/295368 | 11/2007 |
| WO | WO 2015/023204 | 2/2015 |

OTHER PUBLICATIONS

International Search Report and Written Opinion dated Feb. 10, 2017 issued in PCT/US2016/034274.

(Continued)

*Primary Examiner* — Hieu Nguyen
(74) *Attorney, Agent, or Firm* — Weaver Austin Villeneuve & Sampson LLP

(57) ABSTRACT

A power combining arrangement includes an input divider waveguide and an output combiner waveguide, and a first and second amplifier. The power combining arrangement is configured to amplify RF energy having a characteristic wavelength λ. The first amplifier has a first input electrically coupled with a first output port of the divider waveguide. The second amplifier has a second input electrically coupled with a second output port of the divider waveguide. The first and second output ports are separated by a first distance corresponding to a phase delay $Ø_1$, the first distance being selected substantially independently of the characteristic wavelength. The first amplifier has a first output electrically coupled with a first input port of the combiner waveguide and the second amplifier has a second output electrically coupled with a second input port of the combiner waveguide. The first and second input ports are separated by the first distance.

19 Claims, 2 Drawing Sheets

(56) References Cited

U.S. PATENT DOCUMENTS

| | | |
|---|---|---|
| 5,550,513 A | 8/1996 | Wong |
| 5,561,397 A | 10/1996 | Kumar et al. |
| 5,663,683 A | 9/1997 | McCandless |
| 5,880,648 A | 3/1999 | Aves et al. |
| 6,396,349 B2 | 5/2002 | Takei et al. |
| 6,614,590 B2 | 9/2003 | Tatoh |
| 6,677,897 B2 | 1/2004 | Livingston |
| 6,707,348 B2 | 3/2004 | Ammar |
| 7,358,803 B2 | 4/2008 | Goldberg et al. |
| 7,397,308 B2 | 7/2008 | Mordarski |
| 7,924,097 B2 * | 4/2011 | Lender, Jr. ............ H03F 1/42 330/286 |
| 9,065,163 B1 | 6/2015 | Wu et al. |
| 2002/0105383 A1 | 8/2002 | Cheo |
| 2004/0108903 A1 | 6/2004 | Channabasappa et al. |
| 2005/0068249 A1 | 3/2005 | Du Toit et al. |
| 2007/0280576 A1 | 12/2007 | Kucharski et al. |
| 2013/0154773 A1 | 6/2013 | Siprak |
| 2014/0145794 A1 | 5/2014 | Courtney et al. |

OTHER PUBLICATIONS

Jiang, X. et al., "A Ka-Band Power Amplifier Based on the Traveling-Wave Power-Dividing/Combining Slotted-Waveguide Circuit," IEEE Transactions on Microwave Theory and Techniques, vol. 52, No. 2, Feb. 2004.

\* cited by examiner

SOLID STATE TRAVELING WAVE AMPLIFIER FOR SPACE APPLICATIONS

TECHNICAL FIELD

This invention relates generally to a radio frequency (RF) power amplifier, and more particularly to solid state traveling wave amplifiers.

BACKGROUND OF THE INVENTION

The assignee of the present invention manufactures and deploys spacecraft for, inter alia, communications and broadcast services from geostationary orbit. Payload equipment of such spacecraft, intended to operate at a wavelength $\lambda$ within a microwave or millimeter-wave frequency band, typically include RF signal lines and power amplifiers and may include solid state devices to achieve high levels of power. For example, outputs of an input (divider) waveguide may be communicatively coupled with inputs of an output (collector) waveguide by way of a plurality of solid-state power amplifiers, arranged in parallel.

In the absence of the present teachings, a specific phase separation, normally an integer multiple of $\lambda/2$, must be maintained between respective couplings, with the divider waveguide and/or the collector waveguide, of adjacent parallel power amplifiers.

An improved solid state traveling wave amplifier multiplexer design that avoids a necessity to comply with the above-mentioned constraint is desirable.

SUMMARY OF INVENTION

The present inventors have appreciated that a power combining arrangement that includes an input waveguide with serially distributed couplings and an output waveguide with serially distributed couplings, and at least two solid-state amplifiers disposed therebetween may be arranged such that respective input and output ports of the waveguides, with which the solid-state amplifiers are communicatively coupled, are separated by a distance corresponding to an equal phase delay, $\emptyset$, where $\emptyset$ is not necessarily an integer multiple of $\lambda/2$. The arrangement enables a more flexible and generally smaller equipment layout and avoids a need for directional coupler and phase shifting circuits.

According to some implementations, an apparatus includes a power combining arrangement including an input divider waveguide and a serially fed output combiner waveguide, and at least a first solid-state amplifier and a second solid-state amplifier. The power combining arrangement is configured to amplify RF energy having a characteristic wavelength $\lambda$. The first amplifier has a first input terminal electrically coupled with a first output port of the divider waveguide and the second amplifier has a second input terminal electrically coupled with a second output port of the divider waveguide, the first output port and the second output port being separated by a first distance corresponding to a phase delay $\emptyset_1$, the first distance being selected substantially independently of the characteristic wavelength $\lambda$. The first amplifier has a first output terminal electrically coupled with a first input port of the combiner waveguide and the second amplifier has a second output terminal electrically coupled with a second input port of the combiner waveguide, the first input port and the second input port being separated by the first distance corresponding to the phase delay $\emptyset_1$.

In some examples, $\emptyset_1$ may not be an integer multiple of $\lambda/2$. In some examples, $\emptyset_1$ may be less than $\lambda/2$.

In some examples, the first amplifier and the second amplifier may have substantially identical phase delay characteristics.

In some examples, each of the first amplifier and the second amplifier may be configured as a monolithic microwave integrated circuit (MMIC).

In some examples, one or more of the first input terminal, second input terminal, first output terminal and the second output terminal may be a microstrip.

In some examples, one or more of the first output port, the second output port, the first input port and the second input port may be hermetic RF transition ports.

In some examples, the hermetic RF transition ports may be configured to provide a power loss of less than 0.5 dB.

In some examples, the first input terminal may be electrically coupled with the first output port of the divider waveguide only by a first coupling path, the second input terminal may be electrically coupled with the second output port of the divider waveguide only by a second coupling path. The first output terminal may be electrically coupled with the first input port of the combiner waveguide only by a third coupling path. The second output terminal may be electrically coupled with the second input port of the combiner waveguide only by a fourth coupling path. Each of the first coupling path, the second coupling path, the third coupling path and the fourth coupling path may exclude directional couplers.

In some examples, one or both of the divider waveguide in the combiner waveguide may be configured to operate in the TE10 mode.

According to some implementations, an apparatus includes a power combining arrangement including an input divider waveguide and a serially fed output combiner waveguide, and at least a first solid-state amplifier and a second solid-state amplifier. The first amplifier has a first input terminal electrically coupled with a first output port of the divider waveguide and the second amplifier has a second input terminal electrically coupled with a second output port of the divider waveguide, the first output port and the second output port being separated by a first distance corresponding to a phase delay $\emptyset_1$. The first amplifier has a first output terminal electrically coupled with a first input port of the combiner waveguide and the second amplifier has a second output terminal electrically coupled with a second input port of the combiner waveguide, the first input port and the second input port being separated by the first distance corresponding to the phase delay $\emptyset_1$. Each of the first amplifier and the second amplifier is configured as a monolithic microwave integrated circuit (MMIC).

According to some implementations, an apparatus includes a power combining arrangement including an input divider waveguide and a serially fed output combiner waveguide, and at least a first solid-state amplifier and a second solid-state amplifier. The first amplifier is electrically coupled with a first output port of the divider waveguide only by a first coupling path, and the second amplifier is electrically coupled with a second output port of the divider waveguide only by a second coupling path, the first output port and the second output port being separated by a first distance corresponding to a phase delay $\emptyset_1$. The first amplifier is electrically coupled with a first input port of the combiner waveguide only by a third coupling path and the second amplifier is electrically coupled with a second input port of the combiner waveguide only by a fourth coupling path, the first input port and the second input port being separated by the first distance corresponding to the phase delay $\emptyset_1$. Each of the first coupling path, the second coupling path, the third coupling path and the fourth coupling path excludes directional couplers.

BRIEF DESCRIPTION OF THE DRAWINGS

Features of the invention are more fully disclosed in the following detailed description of the preferred embodiments, reference being had to the accompanying drawings, in which.

Figure 1:
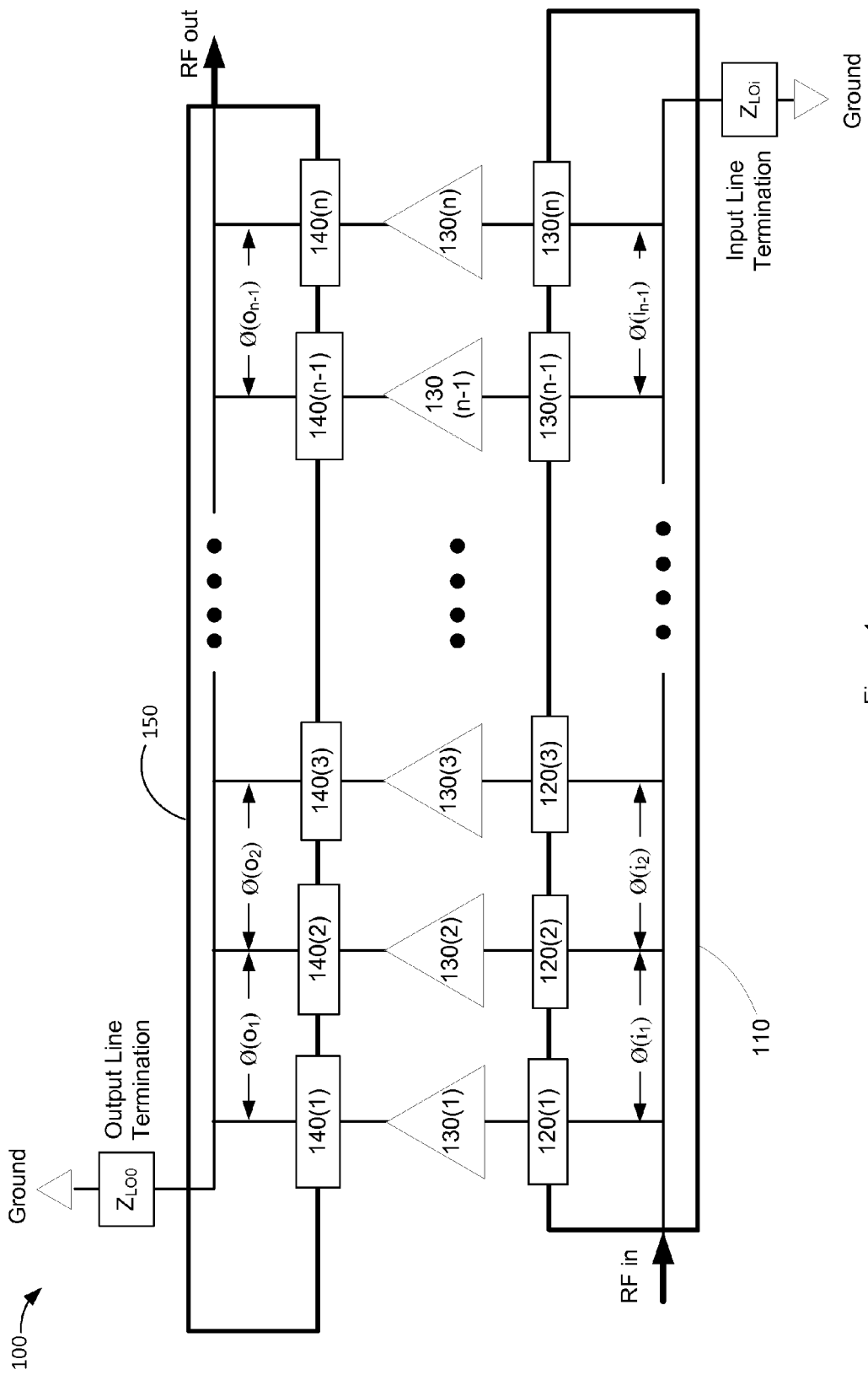
FIG. 1 illustrates an implementation of a power combining arrangement according to an implementation.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. Furthermore, "connected" or "coupled" as used herein may include wirelessly connected or coupled. It will be understood that although the terms "first" and "second" are used herein to describe various elements, these elements should not be limited by these terms. These terms are used only to distinguish one element from another element. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items. The symbol "/" is also used as a shorthand notation for "and/or".

The terms "spacecraft", "satellite" and "vehicle" may be used interchangeably herein, and generally refer to any orbiting satellite or spacecraft system.

Embodiments disclosed hereinbelow include significant improvements to a solid state RF traveling wave amplifier operable with signals characterized by a wavelength λ. In some implementations, a power combining arrangement includes an input waveguide and a serially fed output waveguide, and at least two solid-state amplifiers disposed therebetween. The amplifiers may be arranged such that respective input and output ports of the waveguides, with which the solid-state amplifiers are communicatively coupled, are separated by a distance corresponding to an equal phase delay, Ø, where Ø is not necessarily an integer multiple of λ/2. An improvement in design configuration flexibility and/or a reduction in packaging size of the power combining arrangement is provided as a result of avoiding a requirement for Ø to be an integer multiple of λ/2. Further benefits are achieved by obviating a need for directional couplers and phase shifting circuits.

Referring to FIG. 1, a traveling wave power combining arrangement 100 includes an input (or "divider") waveguide 110 with serially distributed couplings 120 and an output (or "combiner") waveguide 150 with serially distributed couplings 140. In some implementations, one or both of the divider waveguide 110 and the combiner waveguide 150 are low loss TE10 mode waveguides. A plurality of solid state amplifiers 130 couple and amplify RF energy from the divider waveguide 110 into the combiner waveguide 120. In some implementations, the solid-state amplifiers 130 may be or include monolithic microwave integrated circuit (MMIC) amplifiers. In some implementations each MMIC amplifier may introduce a respective phase delay that is similar or substantially identical.

Each solid-state amplifier 130 has a respective coupling 120 with the divider waveguide 110 and a respective coupling 140 with the combiner waveguide guide 150. Each coupling 120 may include a low loss transition between a first microstrip terminal of the solid-state amplifier 130 and a respective output port of the divider waveguide 110. Similarly, each coupling 140 may include a low loss transition between a second microstrip terminal of the solid-state amplifier 130 and a respective input port of the combiner waveguide 150.

In some implementations one or more of the couplings 120 and 140 include a hermetic RF transition (HRT) interface. For example, the couplings 120 may be arranged as a series of HRT interface ports, each HRT interface port being disposed so as to extend through a wall of the divider waveguide 110. Similarly, the couplings 140 may be arranged as a series of HRT interface ports, each HRT interface port being disposed so as to extend through a wall of the divider waveguide 110. The present techniques contemplate avoiding the use of directional couplers or other lossy compliments between the amplifier 130 and the divider waveguide 110 and the combiner waveguide 150. Instead, the amplifier 130 may be electrically coupled with the divider waveguide 110 and the combiner waveguide only by a respective electrical coupling path, each respective coupling path excluding a directional coupler. Instead the respective electrical coupling paths may include an HRT interface port 120 or HRT interface port 140 that introduces only a negligibly small power loss. For example, a power loss on the order of a few tenths of dB may be anticipated, depending on the frequency. As a result, efficiency of the power combining arrangement 100 may be improved.

The distance between sequential couplings 120 on the divider waveguide 110 may be substantially identical to the distance between respective sequential couplings 140 disposed on the combiner waveguide 150. As a result, respective input and output phase delays may also be substantially identical (i.e., $\emptyset(o_1)=\emptyset(i_1)$, $\emptyset(o_2)=\emptyset(i_2)$, and $\emptyset(o_{n-1})=\emptyset(i_{n-1})$).

Advantageously, the phase delays are not necessarily an integer multiple of λ/2, and instead may be selected for convenience, in view of packaging objectives, for example. In order to minimize device volume and mass, for example, the sequential couplings 140 and 120 may be spaced at a distance considerably smaller than λ/2. Moreover, because the spacing may be selected substantially independently of λ, the power combining arrangement 100 may be used without design changes, over a range of signal frequencies and bandwidths.

In some implementations, the solid-state amplifiers are MMIC devices designed for the same input and output impedances which provide inherently consistent transfer phase delays. Advantageously, a provision for phase compensation circuits between sequential couplings 120 may be avoided. In some implementations, three or more MMIC devices may be arranged in parallel between the divider waveguide 110 and the combiner waveguide 150.

Figure 2:
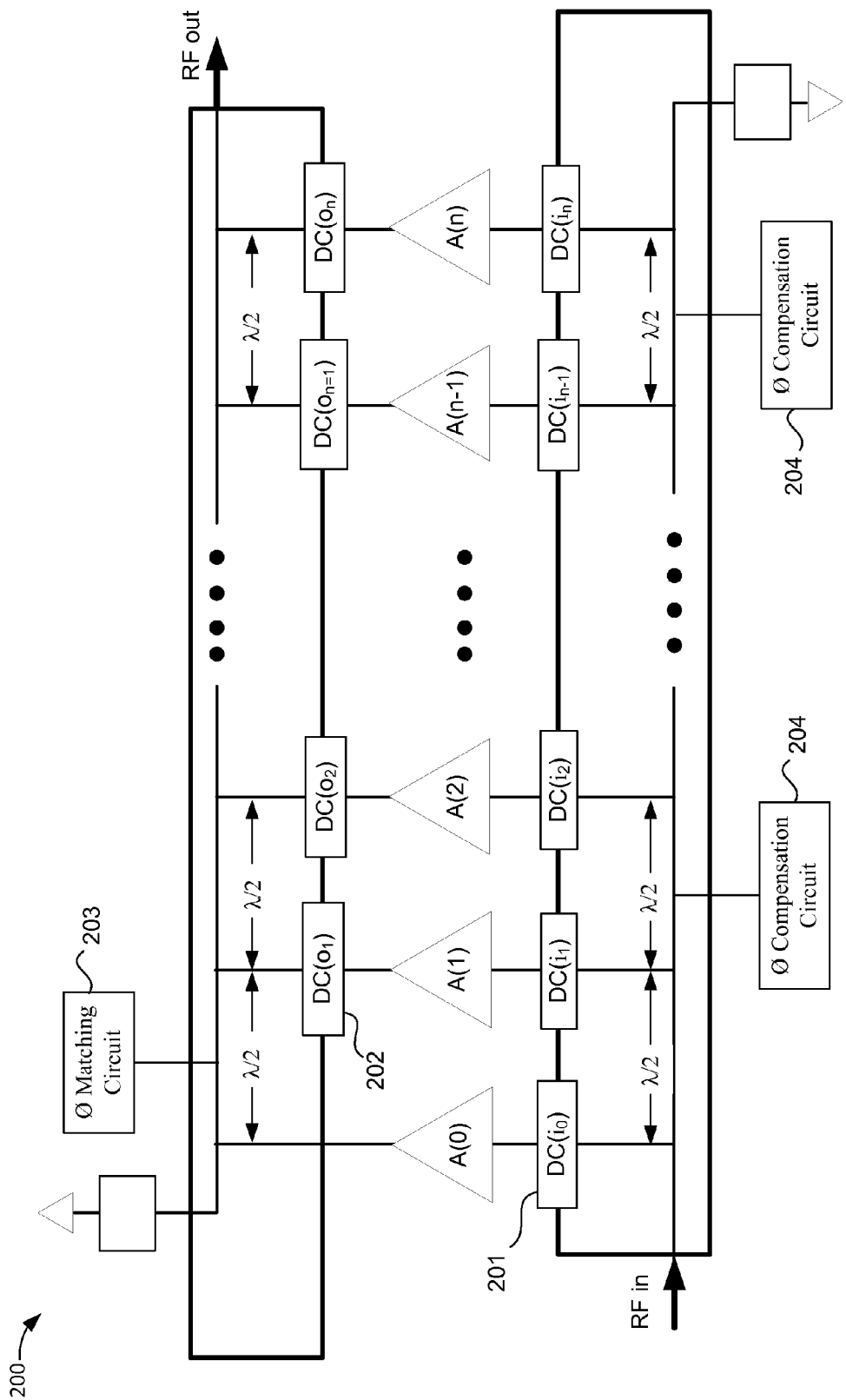
FIG. 2 illustrates an example of a power combining arrangement of the prior art.

Features and benefits of the above disclosed techniques may be better appreciated by considering FIG. 2, which illustrates a power combining arrangement 200 constructed in the absence of the present teachings. For example, as disclosed in U.S. Pat. No. 6,677,897, issued to Livingston and entitled "Solid State Transmitter Circuit", a sequential series of RF amplifiers, A(i) are disposed between an input (divider) RF signal path and an output (combiner) signal path. Divider directional couplers DC(i) 201 are connected to the divider signal path at a spacing of about λ/2. Similarly, combiner directional couplers DC(o) 202 are connected to the combiner signal path at a spacing of about λ/2. A phase matching circuit 203 provides injection of a phased matched signal into the input of the collector signal path. Phase compensation circuits 204 are disposed between at least some sequential pairs of divider directional couplers 201 and may include a pair of capacitors spaced by an electrical length equivalent to a quarter wave wavelength to provide a matched phase shifter with small incremental phase shifts proportional to the capacitance.

Referring again to FIG. 1, it will be appreciated that the present disclosure, advantageously, omits divider directional couplers 201, combiner directional couplers 202, phase matching circuit 203, and phase compensation circuits 204. Furthermore, as noted above, a spacing between sequential amplifier couplings is not necessarily λ/2 or any integer multiple of λ/2. Advantageously, the spacing may be considerably smaller than λ/2. As a result, the power combining arrangement 100, compared with the power combining arrangement 200, has been shown to have reduced mass, cost, complexity and power losses.

Thus, an improved solid state traveling wave amplifier has been disclosed. The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. An apparatus comprising:
 a power combining arrangement including an input divider waveguide and a serially fed output combiner waveguide, and at least a first solid-state amplifier and a second solid-state amplifier; wherein
 one or both of the divider waveguide in the combiner waveguide is configured to operate in the TE10 mode;
  the power combining arrangement is configured to amplify RF energy having a characteristic wavelength λ;
  the first amplifier has a first input terminal electrically coupled with a first output port of the divider waveguide and the second amplifier has a second input terminal electrically coupled with a second output port of the divider waveguide, the first output port and the second output port being separated by a first distance corresponding to a phase delay $Ø_1$, the first distance being selected substantially independently of the characteristic wavelength λ;
  one or more of the first output port, the second output port, the first input port and the second input port are hermetic RF transition ports disposed so as to extend through a wall of the divider waveguide; and
  the first amplifier has a first output terminal electrically coupled with a first input port of the combiner waveguide and the second amplifier has a second output terminal electrically coupled with a second input port of the combiner waveguide, the first input port and the second input port being separated by the first distance corresponding to the phase delay $Ø_1$.

2. The apparatus of claim 1, wherein $Ø_1$ is not an integer multiple of λ/2.

3. The apparatus of claim 1, wherein $Ø_1$ is less than λ/2.

4. The apparatus of claim 1, wherein the first amplifier and the second amplifier have substantially identical phase delay characteristics.

5. The apparatus of claim 1, wherein each of the first amplifier and the second amplifier is configured as a monolithic microwave integrated circuit (MMIC).

6. The apparatus of claim 1, wherein one or more of the first input terminal, second input terminal, first output terminal and the second output terminal is a microstrip.

7. The apparatus of claim 1, wherein the hermetic RF transition ports are configured to provide a power loss of less than 0.5 dB.

8. The apparatus of claim 1, wherein:
 the first input terminal is electrically coupled with the first output port of the divider waveguide only by a first coupling path;
 the second input terminal is electrically coupled with the second output port of the divider waveguide only by a second coupling path;
 the first output terminal is electrically coupled with the first input port of the combiner waveguide only by a third coupling path;
 the second output terminal is electrically coupled with the second input port of the combiner waveguide only by a fourth coupling path; and
 each of the first coupling path, the second coupling path, the third coupling path and the fourth coupling path excludes directional couplers.

9. The apparatus of claim 1, wherein one or both of the divider waveguide in the combiner waveguide is configured to operate in the TE10 mode.

10. An apparatus comprising:
 a power combining arrangement including an input divider waveguide and a serially fed output combiner waveguide, and at least a first solid-state amplifier and a second solid-state amplifier; wherein
 one or both of the divider waveguide in the combiner waveguide is configured to operate in the TE10 mode;
  the first amplifier has a first input terminal electrically coupled with a first output port of the divider waveguide and the second amplifier has a second input terminal electrically coupled with a second output port of the divider waveguide, the first output port and the second output port being separated by a first distance corresponding to a phase delay $Ø_1$;
  the first amplifier has a first output terminal electrically coupled with a first input port of the combiner waveguide and the second amplifier has a second output terminal electrically coupled with a second input port of the combiner waveguide, the first input port and the second input port being separated by the first distance corresponding to the phase delay $\varnothing_1$;

one or more of the first output port, the second output port, the first input port and the second input port are hermetic RF transition ports disposed so as to extend through a wall of the divider waveguide; and each of the first amplifier and the second amplifier is configured as a monolithic microwave integrated circuit (MMIC).

11. The apparatus of claim 10, wherein the first amplifier and the second amplifier have substantially identical phase delay characteristics.

12. The apparatus of claim 10, wherein each hermetic RF transition port is configured to provide a power loss of less than 0.5 dB.

13. The apparatus of claim 10, wherein:

the first input terminal is electrically coupled with the first output port of the divider waveguide only by a first coupling path;

the second input terminal is electrically coupled with the second output port of the divider waveguide only by a second coupling path;

the first output terminal is electrically coupled with the first input port of the combiner waveguide only by a third coupling path;

the second output terminal is electrically coupled with the second input port of the combiner waveguide only by a fourth coupling path; and each of the first coupling path, the second coupling path, the third coupling path and the fourth coupling path excludes directional couplers.

14. The apparatus of claim 10, the power combining arrangement is configured to amplify RF energy having a characteristic wavelength $\lambda$ and the first distance is selected substantially independently of the characteristic wavelength $\lambda$.

15. The apparatus of claim 14, wherein $\varnothing_1$ is not an integer multiple of $\lambda/2$.

16. The apparatus of claim 14, wherein $\varnothing_1$ is less than $\lambda/2$.

17. An apparatus comprising:

a power combining arrangement including an input divider waveguide and a serially fed output combiner waveguide, and at least a first solid-state amplifier and a second solid-state amplifier; wherein one or both of the divider waveguide in the combiner waveguide is configured to operate in the TE10 mode;

the first amplifier is electrically coupled with a first output port of the divider waveguide only by a first coupling path, and the second amplifier is electrically coupled with a second output port of the divider waveguide only by a second coupling path, the first output port and the second output port being separated by a first distance corresponding to a phase delay $\varnothing_1$;

the first amplifier is electrically coupled with a first input port of the combiner waveguide only by a third coupling path and the second amplifier is electrically coupled with a second input port of the combiner waveguide only by a fourth coupling path, the first input port and the second input port being separated by the first distance corresponding to the phase delay $\varnothing_1$;

one or more of the first output port, the second output port, the first input port and the second input port are hermetic RF transition ports disposed so as to extend through a wall of the divider waveguide; and each of the first coupling path, the second coupling path, the third coupling path and the fourth coupling path excludes directional couplers.

18. The apparatus of claim 17, the power combining arrangement is configured to amplify RF energy having a characteristic wavelength $\lambda$ and the first distance is selected substantially independently of the characteristic wavelength $\lambda$.

19. The apparatus of claim 17, wherein $\varnothing_1$ is not an integer multiple of $\lambda/2$.

* * * * *